US008830686B2

(12) United States Patent
Nomoto

(10) Patent No.: US 8,830,686 B2
(45) Date of Patent: Sep. 9, 2014

(54) IN-VEHICLE ELECTRONIC CONTROL UNIT HOUSING

(75) Inventor: Kazuo Nomoto, Toyokawa (JP)

(73) Assignee: Denso Corporation, Kariya (JP)

( * ) Notice: Subject to any disclaimer, the term of this patent is extended or adjusted under 35 U.S.C. 154(b) by 288 days.

(21) Appl. No.: 13/136,195

(22) Filed: Jul. 26, 2011

(65) Prior Publication Data
US 2012/0026703 A1    Feb. 2, 2012

(30) Foreign Application Priority Data

Jul. 27, 2010    (JP) ................................. 2010-167719

(51) Int. Cl.
H05K 5/00    (2006.01)
H05K 5/04    (2006.01)
H05K 5/06    (2006.01)

(52) U.S. Cl.
CPC ............ H05K 5/0078 (2013.01); H05K 5/0073 (2013.01)
USPC ........... 361/752; 361/753; 361/807; 361/810; 439/76.1; 439/76.2

(58) Field of Classification Search
USPC ......... 361/752–753, 807–810; 439/76.1–76.2
See application file for complete search history.

(56) References Cited

U.S. PATENT DOCUMENTS

| | | | |
|---|---|---|---|
| 6,728,110 B2 * | 4/2004 | Koyama | 361/752 |
| 7,510,404 B2 * | 3/2009 | Koyama | 439/76.1 |
| 8,144,476 B2 * | 3/2012 | Hirose | 361/752 |
| 2002/0149918 A1 | 10/2002 | Koyama | |
| 2003/0011776 A1 * | 1/2003 | Ogawa | 356/450 |
| 2004/0095732 A1 * | 5/2004 | Azumi et al. | 361/752 |
| 2006/0036362 A1 | 2/2006 | Ikeda et al. | |
| 2006/0067058 A1 | 3/2006 | Kita | |
| 2006/0289664 A1 | 12/2006 | Tomikawa et al. | |

FOREIGN PATENT DOCUMENTS

| | | |
|---|---|---|
| EP | 1887842 A1 | 2/2008 |
| JP | 2002-308021 | 10/2002 |
| JP | 2005-117887 | 4/2005 |
| JP | 2006-50768 | 2/2006 |
| JP | 2006-093404 | 4/2006 |
| JP | 2008-41718 | 2/2008 |

OTHER PUBLICATIONS

Office action dated Jun. 7, 2012 in corresponding Japanese Application No. 2010-167719.

* cited by examiner

*Primary Examiner* — Tuan T Dinh
(74) *Attorney, Agent, or Firm* — Harness, Dickey & Pierce, PLC

(57) ABSTRACT

A housing for an in-vehicle electronic control unit is disclosed. The housing includes: a case made of resin and formed into a box shape having an opening; a board received in the case and provided with an electronic part, the electronic part being mounted to the board; a cover made of metal and covering the opening of the case so that the board is arranged between the case and the cover; and multiple stays each provided to fix the cover or the case to a vehicle. The multiple stays include a first stay made of the resin and formed on the case, and a second stay made of the metal and formed on the cover.

7 Claims, 5 Drawing Sheets

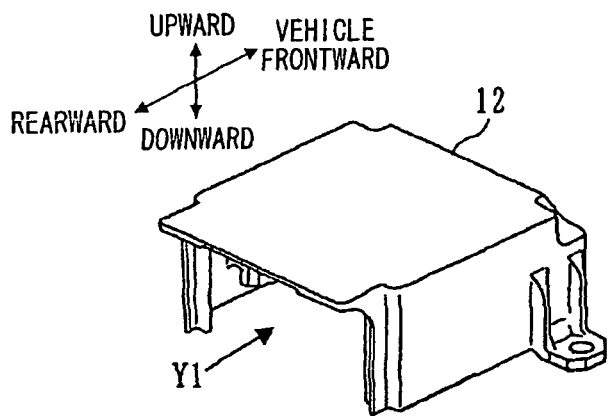
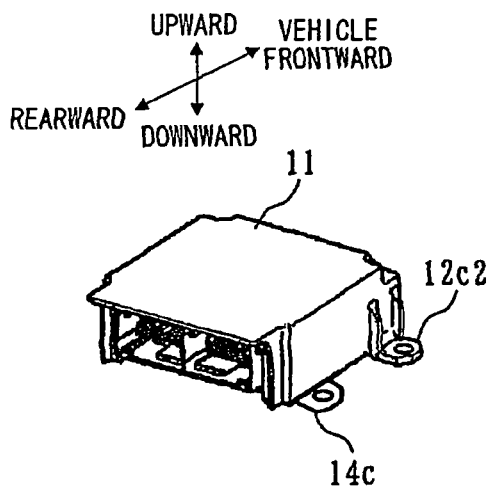
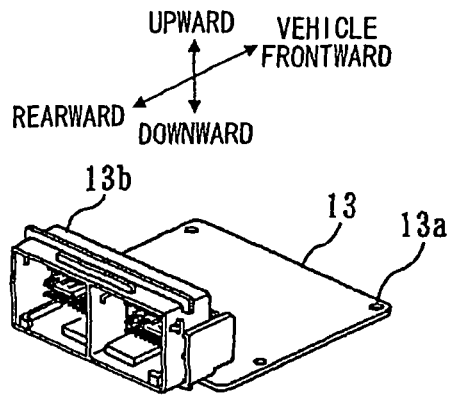
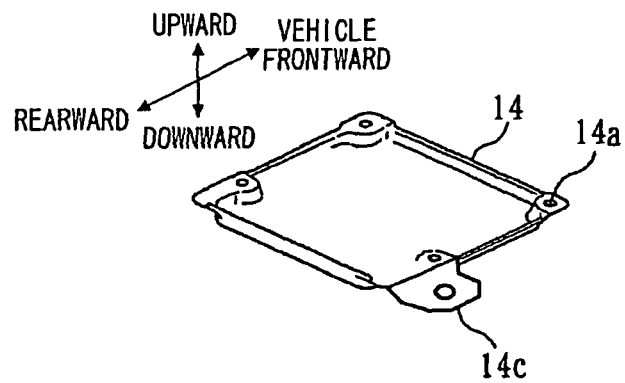

IN-VEHICLE ELECTRONIC CONTROL UNIT HOUSING

CROSS REFERENCE TO RELATED APPLICATION

The present application is based on and claims priority to Japanese Patent Application No. 2010-167719 filed on Jul. 27, 2010, disclosure of which is incorporated herein by reference.

TECHNICAL FIELD

The present invention relates to a box-shaped housing for an in-vehicle electronic control unit applicable to an electric control unit for a passenger protection apparatus, which is an airbag and the like for protecting a passenger at a time of a vehicle collision. In particular, the present invention relates to a housing for an in-vehicle electronic control unit capable of protecting, at a time of a vehicle collision, an electronic part on a control circuit board in the housing.

BACKGROUND

Conventionally, an electronic control unit (abbreviated to hereinafter as an ECU) for an airbag is received in an aluminum die casting housing with a box shape. An ECU housing 1 according to a related art will be illustrated with reference to FIGS. 1A to 1D. The ECU housing 1 includes an aluminum die casting case 2 illustrated in FIG. 1B, a control circuit board 3 (also called "a board" for simplicity) illustrated in FIG. 1C, and an iron sheet cover 4 illustrated in FIG. 1D. The aluminum die casting case 2 has an opening at a bottom thereof. The control circuit board 3 is inserted into an inside of the aluminum die casting case 2 from the opening of the aluminum die casting case 2 and fixed. The iron sheet cover 4 is made of iron, and is fixed at the opening of the aluminum die casting case 2 to cover the opening. In the ECU housing 1, when a vehicle collision is detected with an acceleration sensor (not shown) mounted to the control circuit board 3, a control operation for inflating an airbag (not shown) etc. is performed. JP 2008-41718A1 corresponding to EP 1887842A1 describes this kind of housing for an electronic control unit.

In the above-described ECU housing 1, the aluminum die casting case 2 is heavy in weight and high in manufacturing cost. In view of this, the inventor of the present application conducted a study to make a case 2 of resin. The inventor's findings will be given below. If the case 2 is simply made of resin, an impact at a time of a vehicle collision is absorbed by an elastic property of the resin of the case 2. This deteriorates a transmission of the impact to the acceleration sensor for detecting the impact. In addition, it becomes impossible to connect to ground because the resin case is electrically-non-conductive, while it is possible to connect to ground via the aluminum die casting case 2 in the above related art shown in FIGS. 1A to 1D. Problems of the transmission of the impact and the connection to ground may be solved if the iron sheet cover 4 is provided with multiple stays made of the same iron sheet, and the stays are fixed to the vehicle. In this case, however, since the iron sheet cover 4 is fixed to the vehicle by the multiple stays, there is a concern that the iron sheet cover 4 is deformed due to the impact at a time of vehicle collision and the board 3 is accordingly damaged.

An event data recorder (abbreviated to as "EDR"), which is a recorder for recording a data of speed, acceleration or the like before and after the collision, is mounted to the board 3. The board 3 stores the important data for investigation of a cause of the accident after the collision. In recent years, importance of this kind of accident data is increasing. If the board 3 is damaged at a time of a vehicle collision, there arises a problem that an electronic part on the board 3 is damaged, and it becomes impossible to read out a data from the EDR.

SUMMARY

In view of the foregoing, it is an objective of the present disclosure to provide a housing for an in-vehicle electronic control unit that is capable of protecting an electronic part (e.g., EDR) on a board from being damaged even if an impact due to a vehicle collision is transmitted to the housing.

According to an aspect of the present disclosure, a housing for an in-vehicle electronic control unit includes: a case made of resin and formed into a box shape having an opening; a board received in the case and provided with an electronic part, the electronic part being mounted to the board; a cover made of metal and covering the opening of the case so that the board is arranged between the case and the cover; and multiple stays each provided to fix the cover or the case to a vehicle. The multiple stays include a first stay made of the resin and formed on the case, and a second stay made of the metal and formed on the cover.

According to the above housing, it is possible to protect the electronic part on the board from being damaged even if an impact due to a vehicle collision is transmitted to the housing.

BRIEF DESCRIPTION OF THE DRAWINGS

The above and other objects, features and advantages of the present disclosure will become more apparent from the following detailed description made with reference to the accompanying drawings. In the drawings:

FIG. 2A is a perspective view of an ECU housing according to one embodiment;

FIG. 2B is a perspective view of an housing case of the ECU housing;

FIG. 2C is a perspective view of a control circuit board of the ECU housing;

FIG. 2D is a perspective view of a housing cover of the ECU housing;

EMBODIMENTS

Figure 1B:
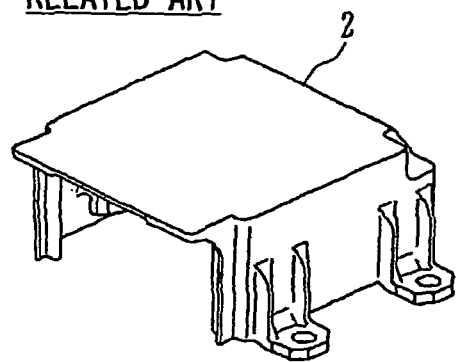
FIG. 1B is a perspective view of an aluminum die casting case according to the related art.
Figure 1A:
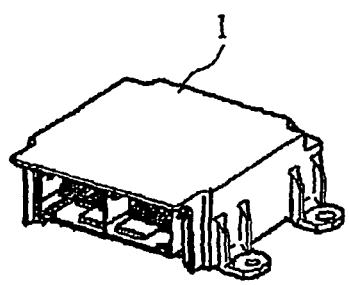
FIG. 1A is a perspective view of a housing for an in-vehicle electronic control unit according to a related art.
Figure 1C:
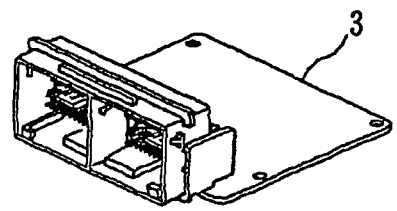
FIG. 1C is a perspective view of a control circuit board according to the related art.
Figure 1D:
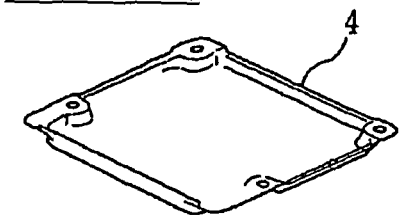
FIG. 1D is a perspective view of an iron sheet cover 4 according to the related art.

Embodiments will be described with reference to the accompanying drawings. Through all of the drawings, like reference numerals are used to refer to like parts corresponding to each other. For like parts, duplicative explanation may be omitted.

FIGS. 2A to 2D illustrate an external view of a housing for an in-vehicle electronic control unit. FIG. 2A illustrates a perspective view of an ECU housing 11. FIG. 2B illustrates a perspective view of a housing case 12. FIG. 2C illustrates a perspective view of a control circuit board 13. FIG. 2D illustrates a perspective view of a housing cover 14.

The ECU housing 11 includes the housing case 12, the control circuit board 13, and the housing cover 14. The housing case 12 is made of resin and has a box shape. The housing case 12 opens on one side surface shown by an arrow Y1 in FIG. 2B. The housing case 12 further opens downwardly. The control circuit board 13 is inserted into an inside of the housing case 12 from an opening of the housing case 12 and fixed. The housing cover 14 is made from an iron sheet and is fixed to a portion of the housing case 12 defining the opening, thereby covering the opening.

Figure 3:
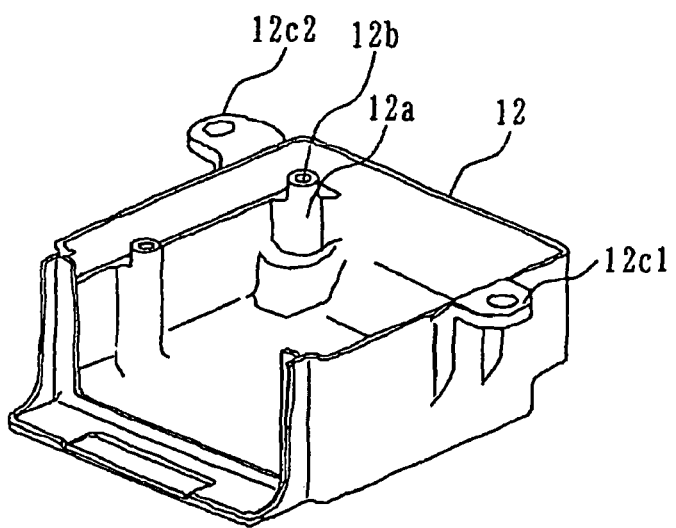
FIG. 3 is a perspective view of the housing case viewed from an opening of the housing case.

FIG. 3 illustrates the inside of the housing case 12 viewed from the opening of the housing. As shown in FIG. 3, the housing case 12 has a first inner side surface on a first side wall and a second inner side surface on a second side wall. The first and second inner side surfaces are arranged facing each other. Two board attachment portions 12a are arranged on each of the first and second inner side surfaces. An end face of each board attachment portion 12a has a screw hole 12b. A case stay 12c1 is arranged on the first side wall, on which the board attachment portions 12a are arranged. Specifically, the case stay 12c1 is located at an edge of a center portion of the first side wall, which center portion is a center in a front-to-rear direction (see FIG. 3). The case stay 12c1 projects from the first side wall toward an outside of the housing case 12 in a horizontal direction. Another case stay 12c2 is arranged on the second side wall, on which other board attachment portions 12a are arranged. Specifically, the case stay 12c2 is located at an edge of a front-side portion of the second side wall, which front-side portion is located frontward in the front-to-back direction of the vehicle (see FIGS. 2A and 2B). The case stays 12c1 and 12c2 are made of resin and project from the housing case 12 toward an outside of the housing case 12 in opposite directions. The case stays correspond to a first stay.

As shown in FIG. 2C, the control circuit board 13 has through-holes 13a, which are located to correspond to the screw holes 12b of respective board attachment portions 12a of the housing case 12. Into the through-hole 13a, a screw (not shown) is inserted. The control circuit board 13 includes a connector 13b, which is fitted into an opening portion on the side surface (see the arrow Y1 in FIG. 2B) of the housing case 12.

Figure 4:
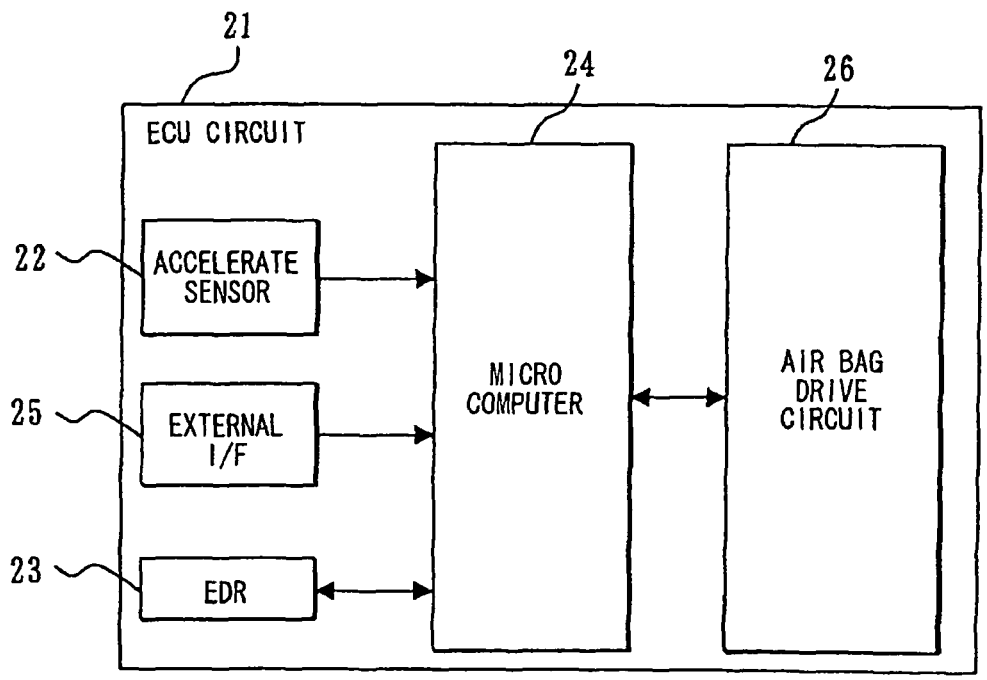
FIG. 4 is a block diagram of an ECU circuit.

The control circuit board 13 includes an ECU circuit 21, as illustrated in FIG. 4. The ECU circuit 21 includes an acceleration sensor 22 for detecting acceleration of the vehicle, an EDR device 23 for recording and storing data, a microcomputer 24 connected with the acceleration sensor 22 and the EDR device 23, an external IF 25 (interface) for having a connection to an airbag and an external acceleration sensor etc. (not shown), and an airbag drive circuit 26 connected to the microcomputer 24.

The external IF 25 is combined with the connector 13b. The microcomputer 24 performs, for example, the following control operation. The microcomputer 24 determines whether a vehicle collision takes places, based on the acceleration detected with the acceleration sensor 22 or the external acceleration sensor (not shown) connected to the external IF 25. If the vehicle collision is determined to take place, the microcomputer 24 outputs this determination result to the airbag drive circuit 26, and causes the airbag drive circuit 26 to inflate the airbag (not shown). Furthermore, the microcomputer 24 performs the following control operation. The microcomputer 24 causes the EDR device 23 to record and store information of the vehicle before and after the vehicle collision as a time-series data. The information of the vehicle includes, for example, vehicle velocity etc. In FIG. 4, the EDU device 23 is external with respect to the microcomputer 24 and connected with the microcomputer 24. Alternatively, the EDU device 23 may be built in the microcomputer 24.

As shown in FIG. 2D, the housing cover 14 has through-holes 14a for screw insertion, which are located to correspond to the through-holes 13a of the control circuit board 13. The housing cover 14 has one cover stay 14c made of metal (specifically made from an iron sheet). The cover stay 14c is integrated with the housing cover 14. When the housing cover 14 and the housing case 12 are assembled, the cover stay 14c projects from an edge of a rear-side portion of the second side wall, the second side wall having the one case stay 12c2, of the housing case 12 toward an outside of the housing case 12 in the horizontal direction. The cover stay of the housing cover 14 corresponds to a second stay.

Figure 5:
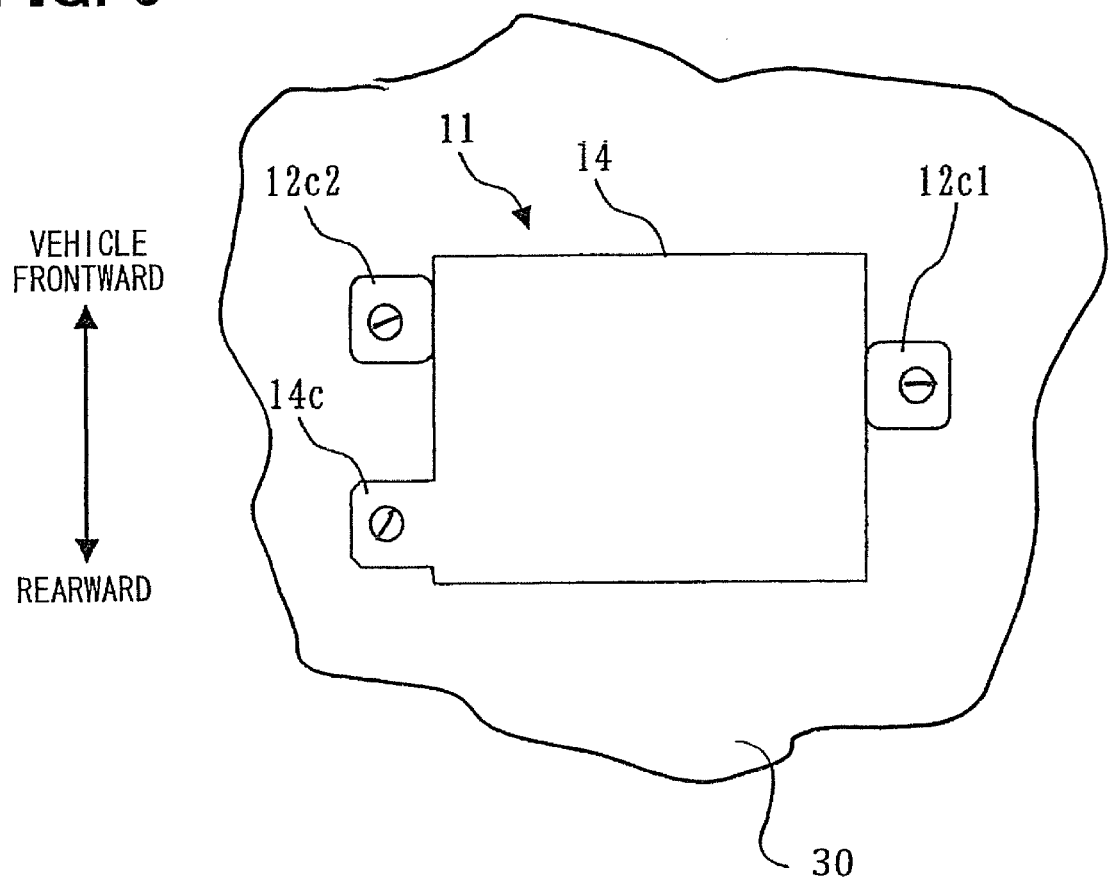
FIG. 5 is a plan view of the ECU housing viewed from the housing cover.

When the housing case 12, the control circuit board 13 and the housing cover 14 are assembled, the through-holes 13a of the control circuit board 13 are aligned with the screw holes 12b of the board attachment portions 12a of the housing case 12, and the connector 13b is fit into the opening portion, which opens rearwardly, on the side surface of the housing case 12. The through-holes 14a of the housing cover 14 are aligned with the through-hole 13a of the control circuit board 13 so that the housing cover 14 acts as a lid. A screw is inserted from each through-hole 14a and threadably engaged with the screw hole 12b, thereby fixing and integrating together as a whole. In this way, the assembly of the ECU housing 11 illustrated in FIG. 2A is completed. The assembled ECU housing 11 is fixed to the vehicle 30 in such manner that the case stays 12c1, 12c2 and the cover stay 14c, which project from side surfaces of the ECU housing 11 in the horizontal direction, are fixed to a vehicle body of vehicle 30 by screw fixation, as shown in FIG. 5.

If the vehicle, to which the ECU housing 11 is fixed in the above-described way, collides while traveling, an impact due to this collision is transmitted to the ECU housing 11 and detected by the acceleration sensor 22. In response to the detection of the collision by the acceleration sensor 22, the microcomputer 24 gives instructions to the airbag drive circuit 26 and the airbag drive circuit 26 controls the airbag so that the airbag is inflated. Furthermore, the microcomputer 24 causes the EDR device 23 to record the vehicle information before and after the vehicle collision as a time-series data. The vehicle information includes vehicle velocity etc.

The impact is transmitted from a front side of the ECU housing 11 fixed to the vehicle body. Thus, the impact is first transmitted to the case stay 12c2, which is located front-most among the case stays 12c1, 12c2 and the cover stay 14c. Next, the impact is transmitted to the case stay 12c1. Thus, the case stays 12c1, 12c2 are broken from frontward one, and the housing case 12 is unengaged, and the impact is transmitted to the cover stay 14c, which is located rearward. Since there is only one cover stay 14c and since this cover stay 14c is made from an iron sheet and fixed to the vehicle body via one screw hole, the cover stay 14c is not broken. Because of this, the housing cover 14 moves in a rotation direction around a screw fixation portion of the cover stay 14c. Since this movement causes absorption of the impact, there is very little the housing cover 14 is deformed or broken. Therefore, the control circuit board 13 fixed to the housing cover 14 is not deformed and broken, and the electronic part constituting the ECU circuit 21 on the control circuit board 13 is protected.

As can be seen from the above, the ECU housing 11 of the present embodiment includes: the housing case 12 made of resin and formed into a box shape having an opening at bottom of the housing case 12; the control circuit board 13 received in the housing case 12 and provided with an electronic part, which is mounted to the control circuit board 13; and the housing cover 14 made of metal and covering the opening of the housing case 12 so that the control circuit board 13 is arranged between the housing case 12 and the housing cover 14; and multiple stays each provided to fix the housing cover 14 or the housing case 12 to the vehicle.

The multiple stays include the case stay 12c made of the resin and formed on the housing case 12, and the cover stay 14c made of the metal and formed on the housing cover 14.

In the above configuration, the ECU housing 11 is fixed to the vehicle by the case stay 12c and the cover stay 14c. If the vehicle collides while traveling, an impact due to this collision is transmitted to the ECU housing 11. Although this transmitted impact force breaks the case stay 12c and disengages the housing case 12, the cover stay 14c is resistant to breakage because the cover stay 14c is made of metal. A breakage of the case stay 12c causes absorption of the impact, and this absorption suppresses an impact on the housing cover 14 fixed to the vehicle by the cover stay 14c, and suppresses deformation of the housing cover 1. Therefore, the control circuit board 13 supported by the housing cover 14 is protected. The electronic part on the control circuit board 13 is protected from being damaged.

The cover stay 14c is formed as one or more stays 14c located at a rear-most area of the housing cover 14, which is closest to the rear of the vehicle among the housing cover 14.

In one example, one cover stay 14c may be formed at the rear-most area of the housing cover 14. When a collision of the vehicle takes place, an impact at a time of the collision is transmitted from the front of the vehicle to rear of the vehicle. In this case, first, the case stay 12c is broken and the housing case 12 is disengaged, and then the impact is transmitted to the cove stay 14c, which is closer to the rear of the vehicle than the case stay 12c is. Since there is only one cover stay 14c and since the cover stay 14c is made of metal and fixed to the vehicle, the housing cover 14 moves in a rotation direction around this fixation portion (i.e., cover stay 14c). Since this movement causes absorption of the impact, the housing cover 14 does not deform generally, and as a result, the control circuit board 13 supported by the housing cover 14 does not deform. The electronic part on the control circuit board 13 is protected.

Figure 6A:
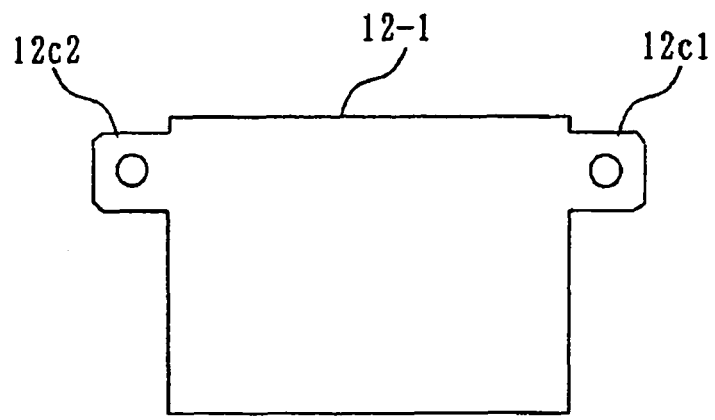
FIG. 6A is a plan view of an housing case viewed from an opening according to an modification example.
Figure 6B:
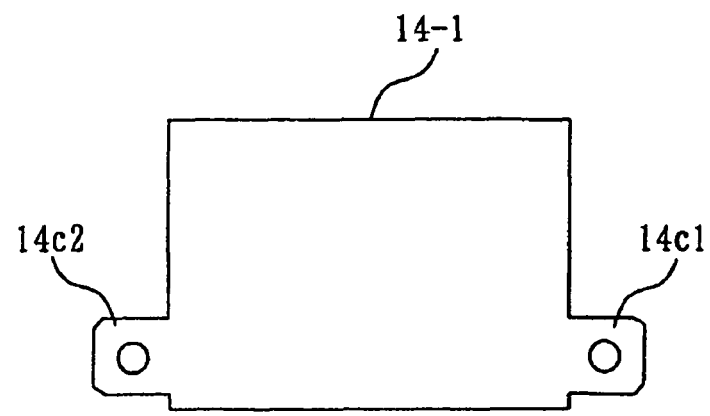
FIG. 6B is a plan view of an housing cover according to the modification example.
Figure 6C:
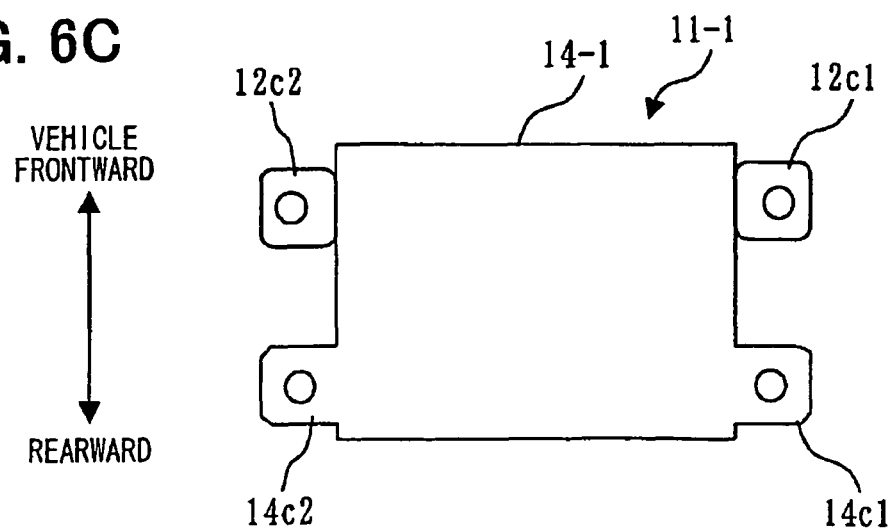
FIG. 6C is a plan view of an ECU housing viewed from the housing cover according to a modification example.

In a modification example, two cover stays 14c1, 14c2 may be formed at a rear-most area of a housing cover 14-1, which is closest the rear of the vehicle among the housing cover 14-1. This modification example is illustrated in FIGS. 6A to 6C. As shown in FIG. 6A, case stays 12c1, 12c2 are formed at a vehicle-front-side portion of a housing case 12-1 and horizontally project from the housing case 12-1 in opposite directions. The case stays 12c1 and 12c2 may project a left direction and a left direction of the vehicle, respectively. As shown in FIG. 6B, the cover stays 14c1, 14c2 are formed at a rear-most area of the housing cover 14-1 and horizontally project from the housing cover 14-1 in opposite directions. The cover stays 14c1 and 14c2 may project in the left direction and the left direction of the vehicle, respectively. As shown in FIG. 6, the housing case 12-1 and the housing cover 14-1 are assembled into a single body to constitute an ECU housing 11-1.

In this structure, the housing cover 14-1 does not move in a rotation direction due to the impact at the vehicle collision. However, since the impact is already absorbed due to breakage of the case stays 12c1, 12c2 at a front-side portion of the ECU housing 11-1, a front-side portion of the housing cover 14-1 floats, and this floatation absorbs the impact. Therefore, the housing cover 14-1 does not deform generally, and as a result, the control circuit board 13 supported by the housing cover 14-1 does not deform. Accordingly, the electronic component on the control circuit board 13 is protected. In the above, the housing cover 14-1 is fixed by the cover stays 14c1 14c2 at two places in a rear-side portion of the ECU housing 11-1.

Since the EDR device 23, which is included in the protected electronic part, is protected in the above way, the information of the vehicle stored in the EDR device 23 can be read out after the collision and can be used for accident analysis etc. The information of the vehicle stored in the EDR device 23 may include at least the speed or acceleration of the vehicle before and after the collision.

According to an example of the present disclosure, a housing for an in-vehicle electronic control unit may be configured in the following way. The housing includes: a case made of resin and formed into a box shape having an opening; a board received in the case and provided with an electronic part, the electronic part being mounted to the board; a cover made of metal and covering the opening of the case so that the board is arranged between the case and the cover; and multiple stays each provided to fix the cover or the case to a vehicle. The multiple stays include a first stay made of the resin and formed on the case, and a second stay made of the metal and formed on the cover.

According to the above configuration, the housing for an in-vehicle electronic control unit can be fixed to the vehicle by the first stay and the second stay. When the vehicle collides while traveling, an impact due to the collision is transmitted to the housing. Since the first stay is made of resin as the case is, if an impact force is so large to cause adverse effect on the board inside the case, the first stay is broken and separated, and the breakage and separation of the first stay inhibits application of an excessive stress to the board. In addition, since the second stay is made of metal as the cover is, it is possible to ensure transmission of the impact force to the acceleration sensor, enabling a high accuracy collision determination. Furthermore, it is possible to ensure that the board is grounded to the vehicle body via the second stays made of metal, and thus, it is possible to reduce noise.

The above housing for an in-vehicle electronic control unit may be configured as follows. The first stay and the second stay may be located on one side of the housing. The first stay may be formed on a vehicle-front-side portion of the case. The second stay may be formed on a vehicle-rear-side portion of the cover, so that the first stay is closer to a front of the vehicle than the second stay is.

According to the above configuration, the following advantage is obtainable. If the collision takes place at the front of the vehicle, an impact force is transmitted from the front of the vehicle. Since the first stay is formed so to be closer to the front of the vehicle than the second stay is, the impact force is first transmitted to the first stay and breaks and separates the first stay. Therefore, it is possible to inhibit the application of an excessive stress to the board.

The above housing for an in-vehicle electronic control unit may be configured as follows. The second stay includes at least one stay that is formed on a rear-most area of the cover, which is closest to a rear of the vehicle among other areas of the cover.

According to the above configuration, the following advantage is obtainable. Upon the collision of the vehicle, the impact force is transmitted from the front of the vehicle to the rear of the vehicle. In this case, the first stay is broken and the case is disengaged, and then, the impact is transmitted to the second stay at the rear-side portion. Since there is only one second stay, and since the second stay is made of metal and fixed to the vehicle, the cover moves in a rotation direction around this fixation part and the impact is absorbed due to the movement in the rotation direction. Thus, in general, the cover does not deform, and the board supported by the cover does not deform accordingly. The electronic part on the board is protected.

The above housing for an in-vehicle electronic control unit may be configured as follows. The second stay includes two stays that are formed on the rear-most area of the cover and parallel to a vehicle front-to-rear direction.

According to the above configuration, although the movement of the cover in the rotation direction does not occur due to the impact at the time of the vehicle collision, a front side portion of the cover floats, and the impact is absorbed by this floatation. Thus, in general, the cover does not deform, and the board supported by the cover does not deform. As a result, the electronic part on the board is protected. In the above, the front side portion of the cover is located frontward than the second stays located at a rear-side portion is.

The above housing for an in-vehicle electronic control unit may be configured as follows. The electronic part includes a recorder for recording information of the vehicle before and after a collision of the vehicle.

According to this configuration, since the recorder is protected from the collision of the vehicle, the information of the vehicle before and after the collision of the vehicle stored in the recorder can be read out and used for analysis etc. after the collision.

The information of the vehicle may include at least one of speed of the vehicle and acceleration of the vehicle.

According to the above configuration, since the information of the vehicle includes at least one of the speed of the vehicle and the acceleration of the vehicle, the speed or acceleration of the vehicle before and after the collision can be read out and used for a more proper analysis of the collision.

While embodiments have been described above, it is to be understood that the invention is not limited to the above described embodiments and constructions. The invention is intended to cover various modifications and equivalent arrangements.

What is claimed is:

1. A housing for an in-vehicle electronic control unit for a vehicle, the housing comprising:
   a case made of resin and formed into a box shape having an opening, which opens downwardly;
   a board including an electronic component received in the case;
   a cover made of metal and covering the opening of the case so that the board is arranged between the case and the cover;
   a first stay made of the resin and formed on a vehicle-front-side portion of the case attaching the case directly to the vehicle, and
   a second stay made of the metal and formed on a vehicle-rear-side portion of the cover attaching the cover directly to the vehicle.

2. The housing according to claim 1, wherein:
   the second stay is provided as at least one stay that is formed on a rear-most area of the cover, which is closest to a rear of the vehicle among the cover.

3. The housing according to claim 1, wherein:
   the electronic component includes a recorder for recording information of the vehicle before and after a collision of the vehicle.

4. The housing according to claim 1, wherein:
   the first stay and the second stay are not located on opposite sides of the housing but located on a same side of the housing; and
   the first stay is closer to a front of the vehicle than the second stay.

5. The housing according to claim 1, wherein
   the case defines an attachment hole separate from the first stay;
   the cover defines a through-hole corresponding to the attachment hole of the case; and
   the attachment hole of the case and the through-hole of the cover are provided to fix the cover to the case using a fastener.

6. The housing according to claim 2, wherein:
   the second stay is provided as two stays that are formed on the rear-most area of the cover and parallel to a vehicle front-to-rear direction.

7. The housing according to claim 3, wherein:
   the information of the vehicle includes at least one of speed of the vehicle or acceleration of the vehicle.

* * * * *